United States Patent
Calcagno-Mani et al.

(10) Patent No.: US 9,251,584 B2
(45) Date of Patent: Feb. 2, 2016

(54) SIMULTANEOUS HIGH SPATIAL LOW TEMPORAL RESOLUTION MAGNETIC RESONANCE (MR) SEQUENCE FOR DYNAMIC CONTRAST ENHANCED (DCE) MAGNETIC RESONANCE IMAGING (MRI)

(71) Applicant: KONINKLIJKE PHILIPS N.V., Eindhoven (NL)

(72) Inventors: Claudia Calcagno-Mani, New York, NY (US); Stefan E. Fischer, Beachwood, OH (US); Melanie Suzanne Kotys, Shaker Heights, OH (US); Venkatesh Mani, New York, NY (US); Philip Martyn Robson, Union City, NJ (US); Sarayu Ramachandran, New York, NY (US); Zahi Adel Fayad, Larchmont, NY (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/386,875

(22) PCT Filed: Mar. 26, 2013

(86) PCT No.: PCT/IB2013/052383
§ 371 (c)(1),
(2) Date: Sep. 22, 2014

(87) PCT Pub. No.: WO2013/144828
PCT Pub. Date: Oct. 3, 2013

(65) Prior Publication Data
US 2015/0049931 A1 Feb. 19, 2015

Related U.S. Application Data
(60) Provisional application No. 61/617,965, filed on Mar. 30, 2012.

(51) Int. Cl.
*G06K 9/00* (2006.01)
*G06T 7/00* (2006.01)
(Continued)

(52) U.S. Cl.
CPC .......... *G06T 7/0012* (2013.01); *G01R 33/4818* (2013.01); *G01R 33/56308* (2013.01); *G06T 5/00* (2013.01); *G06T 5/001* (2013.01); *G01R 33/5601* (2013.01); *G01R 33/56366* (2013.01)

(58) Field of Classification Search
None
See application file for complete search history.

(56) References Cited

U.S. PATENT DOCUMENTS 5,522,390 A 6/1996 Tuithof
7,885,442 B2 2/2011 Lorenz
(Continued)

OTHER PUBLICATIONS

Vomweg, Toni W. et al "Combination of Low and High Resolution Sequences in Two Orientations for Dynamic Contrast-Enhanced MRi of the Breast: more than a Compromise", Eur. Radiology, vol. 14, 2004, pp. 1732-1742.
(Continued)

*Primary Examiner* — Hadi Akhavannik

(57) ABSTRACT

A dual magnetic resonance imaging method simultaneously acquires a first and a second time series of MR images wherein the temporal resolution of the first time series of images is larger than that of the second time series while the spatial resolution of the first time series of images is smaller than that of the second time series. Accordingly, in the context of DCE-MRI, the first time series can be used to determine the arterial input function (AIF) while the second time series can be used to determine the concentration time course in the tissue of interest, e.g. in a vessel wall. Therefore, both the AIF and the tissue time course can be acquired with their optimal dynamic signal range.

20 Claims, 4 Drawing Sheets

(51) Int. Cl.
*G01R 33/48* (2006.01)
*G01R 33/563* (2006.01)
*G06T 5/00* (2006.01)
*G01R 33/56* (2006.01)

(56) References Cited

U.S. PATENT DOCUMENTS

2006/0072799 A1* 4/2006 McLain .................. 382/128

2010/0253342 A1* 10/2010 Kimura .................. 324/309

OTHER PUBLICATIONS

Calcagno, C. et al "SHILO: Simultaneous High/Low Spatial/Temporal Resolution Dual-Imaging Acquisition for Improved Parameters Quantification in Dynamic COntrast Enhanced (DCE) MRI of Atherosclerosis", Proc. Intl. Society Magnetic Resonance in Medicine, vol. 19, 2011, pp. 3316.

* cited by examiner

SIMULTANEOUS HIGH SPATIAL LOW TEMPORAL RESOLUTION MAGNETIC RESONANCE (MR) SEQUENCE FOR DYNAMIC CONTRAST ENHANCED (DCE) MAGNETIC RESONANCE IMAGING (MRI)

CROSS-REFERENCE TO PRIOR APPLICATIONS

This application is the U.S. National Phase application under 35 U.S.C. §371 of International Application No. PCT/IB2013/052383, filed on Mar. 26, 2013, which claims the benefit of U.S. Provisional Patent Application No. 61/617,965, filed on Mar. 30, 2012. These applications are hereby incorporated by reference herein.

The present application relates generally to medical imaging. It finds particular application in conjunction with dynamic contrast enhanced (DCE) magnetic resonance imaging (MRI) and will be described with particular reference thereto. However, it is to be understood that it also finds application in other usage scenarios and is not necessarily limited to the aforementioned application.

DCE MRI is an imaging technique extensively used to study the extent and properties of tumor vascularization. It involves rapid acquisition of serial images after bolus administration of clinically available contrast agents, such as Gadolinium (Gd)-chelates. DCE MRI data can be analyzed using "model-free" and "model-based" methods. Model-free parameters are easy to calculate but their relationship with microvascular physiology is unclear. Model-based approaches can be used to extract physiological parameters from uptake curves.

One of the most common kinetic models used in DCE MRI is the Tofts and Kermode (TK) model, which estimates several kinetic parameters in the tissue of interest. Such kinetic parameters include one or more of: (1) the transfer constant from the plasma compartment to the tissue of interest ($K^{trans}$); (2) the transfer constant from the tissue of interest to the plasma compartment ($K_{ep}$); (3) the fractional plasma volume ($v_p$); and (4) the extra-vascular extra-cellular volume ($v_e$). Kinetic parameters can be calculated if the concentration of contrast agent in the plasma compartment (i.e., the arterial input function (AIF)) and in the tissue of interest can be sampled with reasonable accuracy. However, adequate sampling of both the AIF and tissue kinetics can prove to be a difficult task.

Due to several reasons, optimal sampling of the AIF may require choosing different imaging parameters than the imaging parameters required for optimal tissue imaging. Therefore, reliably acquiring both AIF and tissue curves in the same acquisition is a challenging task. For example, the contrast agent concentration in the vessel lumen is much higher than the concentration accumulating in target tissues, resulting in different dynamic signal ranges for the two compartments. Furthermore, dynamic imaging of tissues requires high in-plane spatial resolution to capture their heterogeneity and avoid partial volume effect (PVE), while sufficient pixel-by-pixel signal-to-noise ratio (SNR) needs to be maintained to carry out accurate analyses. Adequate slice coverage is also needed to evaluate the extent of the disease. These requirements can be usually met if slower scan times can be tolerated. However, several studies show that to accurately perform kinetic modeling, time resolutions slower than 6-8 s can lead to significant errors in parameters estimation (e.g., greater than 50% depending on the model used and the parameters considered). This can potentially impact the sensitivity and specificity of DCE MRI in evaluating tissues physiology and its modifications due to disease.

First pass perfusion imaging of the myocardium exemplifies some of the challenges of DCE MRI. The reliability of perfusion measurements depends on both the accuracy of the arterial input function (AIF), SNR and contrast-to-noise ratio (CNR) in the ventricle (or other tissues). The concentrations of contrast agent reached in the plasma compartment are typically much higher than the net effective concentration in target tissues. As a result, the dynamic signal range of the two compartments is very different and may require different imaging parameters to be captured.

When using saturation prepared gradient echo acquisitions, a combination of low-dose of contrast agent to avoid T2* signal contamination and short saturation delay (SD) to account for the fast T1 recovery, is suitable for accurate assessment of the AIF. However, this combination typically causes weak enhancement and poor CNR in target tissues. A combination of long SD to account for slower recovery of the longitudinal magnetization and high-dose of contrast agent, is instead favorable for strong enhancement in the myocardial wall. However, this combination typically leads to inaccurate AIF estimation, because of near-complete recovery of blood magnetization, non-linearity of the contrast agent concentration-to-signal relationship, and/or susceptibility-induced T2* effects at peak contrast agent concentration.

To overcome these obstacles with first pass perfusion imaging of the myocardium, dual-bolus or dual-imaging methods can be used. In dual-bolus methods, a low dose of contrast agent is injected first for optimal AIF data acquisition, followed by a higher-dose injection for tissue data acquisition. Since the two acquisitions are kept separate, imaging parameters (such as SD, spatial and temporal resolution) can also be customized for each case. In dual-imaging methods, a turboFLASH sequence is used for simultaneous AIF and tissue data acquisition. A short SD is used for the AIF data acquisition, while a long SD is used for tissue data acquisition. Both dual-bolus and dual-imaging approaches have been proven successful in improving quantification of perfusion parameters in the myocardium. However, the need for two separate injections and data acquisitions complicates the use of dual-bolus methods. Further, known dual-imaging methods to date do not capture images at different temporal resolutions.

The present application provides new and improved methods and systems which overcome the above-referenced challenges of DCE MRI and others by building on techniques developed for first pass perfusion imaging of the myocardium.

In accordance with one aspect, a magnetic resonance (MR) system images a subject. The system includes an MR scanner defining an examination volume and configured to apply an imaging sequence to the examination volume. The imaging sequence includes a plurality of saturation pulses. After a first saturation delay (SD) after at least one of the plurality of saturation pulses, image data for a first image is collected in a first shot spaced the first SD from the saturation pulse. Further, after a second SD after the at least one of the plurality of saturation pulses, image data for one of a plurality of second images is collected in a second shot spaced the second SD from the saturation pulse. The MR scanner is further configured to, in response to the imaging sequence, receive the image data for the first image and the plurality of second images. A temporal resolution of the second images exceeds a temporal resolution of the first image, and a spatial resolution of the first image exceeds a spatial resolution of the second images.

In accordance with another aspect, a method images a subject. The method includes applying by an MR scanner an imaging sequence to an examination volume. The imaging sequence includes a plurality of saturation pulses. After a first saturation delay (SD) after at least one of the plurality of saturation pulses, image data for a first image is collected in a first shot spaced the first SD from the saturation pulse. Further, after a second SD after the at least one of the plurality of saturation pulses, image data for one of a plurality of second images is collected in a second shot spaced the second SD from the saturation pulse. The method further includes, in response to the imaging sequence, receiving by the MR scanner the image data for the first image and the plurality of second images. A temporal resolution of the second images exceeds a temporal resolution of the first image, and a spatial resolution of the first image exceeds a spatial resolution of the second images.

In accordance with another aspect, a dynamic contrast enhanced (DCE) magnetic resonance (MR) system images a subject injected with a contrast agent. The system includes an MR scanner defining an examination volume and configured to apply a series of radiofrequency (RF) pulses to the examination volume, each pulse inducing resonance. After a short delay after each pulse, resonance imaging data for each of a plurality of high temporal resolution, low spatial resolution images is acquired. After a long delay after each of a plurality of the pulses and after collecting the resonance imaging data for one of the high temporal, low spatial resolution images, resonance imaging data for low temporal resolution, high spatial resolution images is acquired. The resonance imaging data acquired the short delay after each of the pulses is reconstructed into one of the plurality of high temporal resolution, low spatial resolution images, and the resonance imaging data acquired the long delay after a plurality of pulses is reconstructed into one of the low temporal resolution, high spatial resolution images.

One advantage resides in the concurrent acquisition of a low spatial/high temporal resolution image and a high spatial/low temporal resolution image.

Another advantage resides in the simultaneous acquisition of multiple images using different imaging parameters.

Another advantage resides in accurate sampling of the arterial input function (AIF) and tissue curves.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
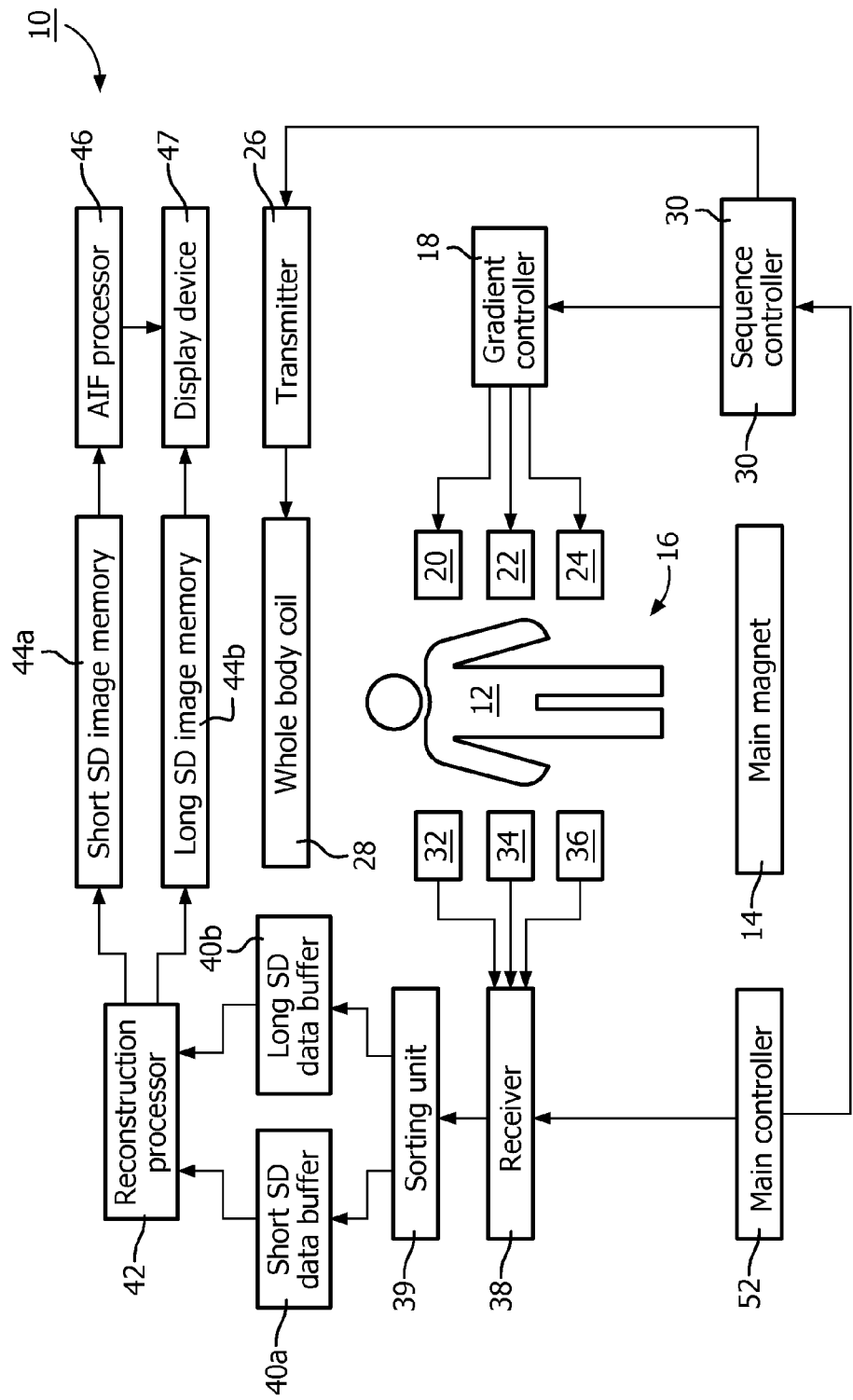
FIG. 1 illustrates a block diagram of a magnetic resonance (MR) system employing a Simultaneous High Low (SHILO) imaging sequence.

With reference to FIG. 1, a magnetic resonance (MR) system 10 utilizes magnetic resonance to form two- or three-dimensional images of a subject 12. The system 10 includes a main magnet 14 that creates a strong, static $B_0$ magnetic field extending through an examination volume 16. The examination volume 16 is sized to accommodate the subject 12. The strength of the static $B_0$ magnetic field is commonly one of 0.23 Tesla, 0.5 Tesla, 1.5 Tesla, 3 Tesla, 7 Tesla, and so on in the examination volume 16, but other strengths are contemplated.

Figure 3:
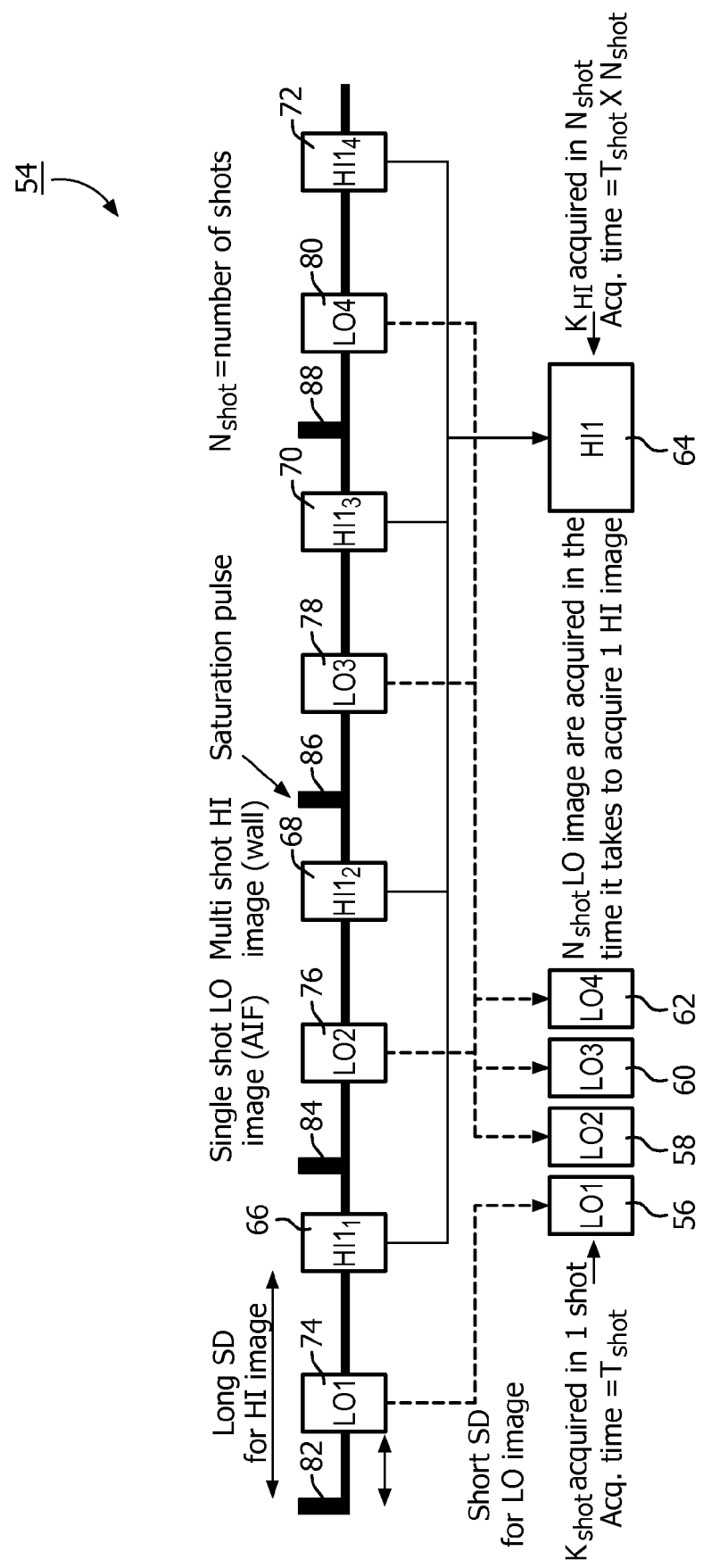
FIG. 3 illustrates a sequence diagram showing the SHILO imaging sequence.

A gradient controller 18 controls a plurality of magnetic field gradient coils 20, 22, 24 to selectively superimpose magnetic field gradients, such as x, y and z gradients, on the static $B_0$ magnetic field in the examination volume 16. Further, a transmitter 26 transmits $B_1$ resonance excitation and manipulation radiofrequency (RF) pulses into the examination volume 16 with one or more transmit coils 28, such as a whole body coil. The $B_1$ pulses are typically of short duration and, when taken together with the magnetic field gradients, achieve a selected manipulation of magnetic resonance. For example, the $B_1$ pulses excite the hydrogen dipoles to resonance and the magnetic field gradients encode spatial information in the frequency and phase of the resonance signal. A sequence controller 30 controls the transmitter 26 and/or the gradient controller 18 to implement a selected imaging sequence within the examination volume 16 (e.g., the sequence of FIG. 3), the imaging sequence defining a sequence of $B_1$ pulses and/or magnetic field gradients.

In response to an imaging sequence, spatially encoded magnetic resonance signals are produced from the examination volume 16. These spatially encoded magnetic resonance signals are received by a plurality of receive coils 32, 34, 36, such as a whole body receive coil. A receiver 38 demodulates the received signals to image data. Short saturation delay (SD) image data and long SD image data are sorted by a sorting unit 39 and stored in a corresponding one of a short SD data buffer 40a (i.e., a memory) and a long SD data buffer 40b (i.e., a memory) for image reconstruction by a reconstruction processor 42. The receiver 38 captures and demodulates the spatially encoded magnetic resonance signals according to one or more imaging parameters, such as saturation SD, spatial resolution and temporal resolution. The reconstructed images are then stored in a short SD image memory 44a and a long SD image memory 44b.

The reconstructed images can be used by an arterial input function (AIF) processor 46 to determine an AIF suitable for a vessel wall. For example, an image with the long SD can be a high spatial resolution, low temporal resolution image of a vessel wall and images with the short SD can be low spatial resolution, high temporal resolution images used by the AIF processor 46 to determine the AIF of the vessel wall. Further, the reconstructed images and/or the AIF can be displayed on a display device 47. For example, the AIF can be concurrently displayed with the vessel wall, such as overlaid or side by side, by the display device 47.

Figure 2:
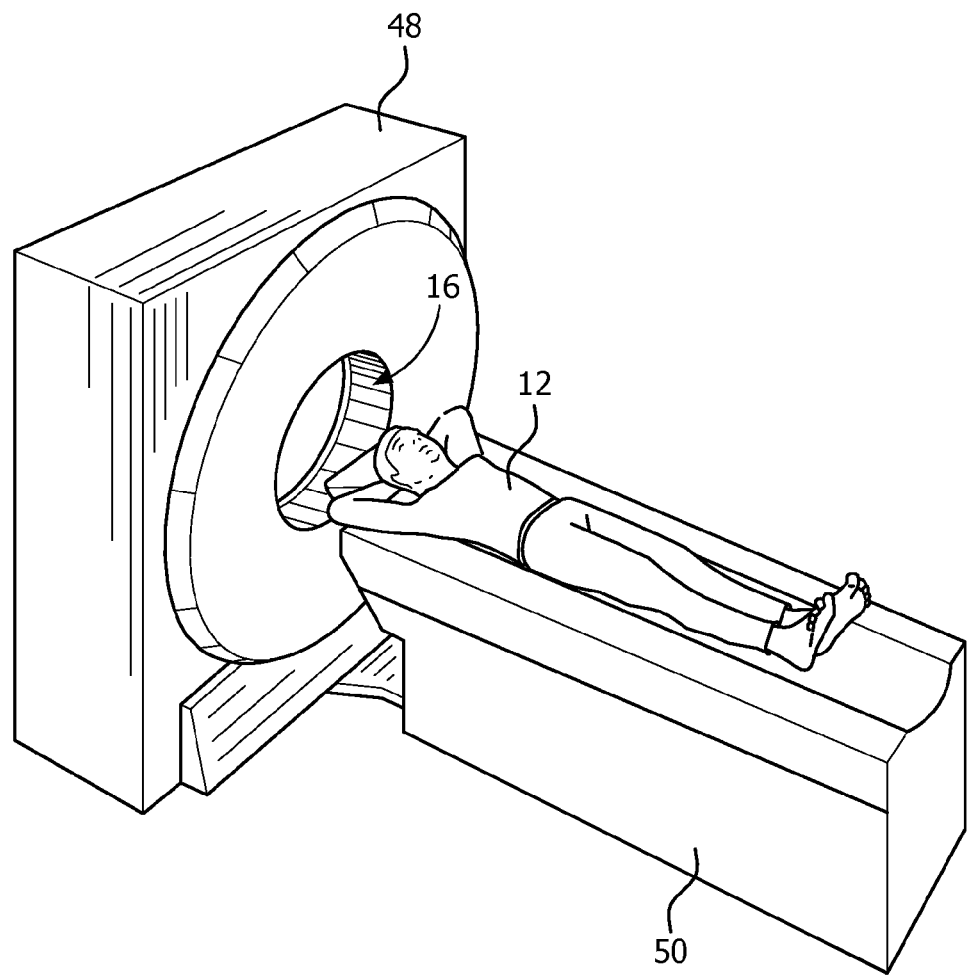
FIG. 2 illustrates a schematic diagram of a bore-type MR scanner.

With reference to FIG. 2, the MR system 10 includes a scanner 48 and, optionally, a support 50. The scanner 48 defines the examination volume 16 and includes the main magnet 14, the receive coils 32, 34, 36, the gradient coils 20, 22, 24, and the transmit coils 28 positioned around the examination volume 16. The scanner 48 can also, but need not, include one or more of the transmitter 26, the receiver 38, the gradient controller 18, and the sequence controller 30. The support 50 supports the subject 12 and facilitates positioning the subject 12 in the examination volume 16 during imaging. As illustrated, the scanner 48 is bore-type, but C-type, open-type, or the like are contemplated.

Referring back to FIG. 1, during imaging, the subject 12 is arranged in the examination volume 16. The main magnet 14 generates the static $B_0$ magnetic field with which hydrogen dipoles in the subject 12 preferentially align. Further, with reference to FIG. 3, a main controller 52 controls the sequence controller according to a Simultaneous High Low (SHILO) imaging sequence 54 and controls the receiver 38 to simultaneously capture image data for a plurality of LO images 56, 58, 60, 62 and a HI image 64 generated in response to the SHILO imaging sequence 54.

The LO images 56, 58, 60, 62 include low spatial resolution and high temporal resolution compared to the HI image 64. In other words, a temporal resolution of the LO images 56, 58, 60, 62 exceeds a temporal resolution of the HI image 64, and a spatial resolution of the HI image 64 exceeds a spatial resolution of the LO images 56, 58, 60, 62. The spatial resolution of the LO images 56, 58, 60, 62 is less than the spatial resolution of the HI image 64 because fewer lines of k-space are generated for each LO image than the HI image 64. The HI image 64 is captured across a plurality of shots 66, 68, 70, 72 and the LO images 56, 58, 60, 62 are each captured across one or more shots 74, 76, 78, 80. As used herein, a shot is defined as a k-space data sampling period. Typically, the number of shots of the one or more shots 74, 76, 78, 80 is less than the number of shots of the plurality of shots 66, 68, 70, 72. A full set of LO image data can be sampled in one or small number of shots, while a full set of HI image data is sampled over a larger number of shots.

The SHILO imaging sequence 54 includes a plurality of saturation pulses 82, 84, 86, 88 repeated according to a saturation repetition time. The saturation repetition time is long enough to acquire k-space lines for a both the HI image 64 and the LO images 56, 58, 60, 62 with a single saturation pulse. Subsequent to each of a plurality of the plurality of saturation pulses 82, 84, 86, 88, but before the next saturation pulse, the SHILO imaging sequence 54 includes a shot for the HI image 64 at a HI SD measured from the saturation pulse. Further, subsequent to each of a plurality of the plurality of saturation pulses 82, 84, 86, 88, but before the next saturation pulse, the SHILO imaging sequence 54 includes a shot for the LO images 56, 58, 60, 62 at a LO SD measured from the saturation pulse. The LO SD is typically less than the HI SD.

Typically, each of the plurality of saturation pulses 82, 84, 86, 88 is followed by a shot for the LO images 56, 58, 60, 62 or every predetermined number, such as two or four, of the plurality of saturation pulses 82, 84, 86, 88 is followed by a shot for the LO images 56, 58, 60, 62. Similarly, each of the plurality of saturation pulses 82, 84, 86, 88 is typically followed by a shot for the HI image 64 or every predetermined number, such as two or four, of the plurality of saturation pulses 82, 84, 86, 88 is typically followed by a shot for the HI image 56, 58, 60, 62. Typically, each of the plurality of saturation pulses 82, 84, 86, 88 is followed by a shot to collect image data for both the HI image 64 and the LO images 56, 58, 60, 62. However, each of the plurality of saturation pulses 82, 84, 86, 88 can be followed by a shot for only one of the HI image 64 and a LO image. Where a saturation pulse is followed by a shot for the HI image 64 and a shot for the LO images 56, 58, 60, 62, the two shots are non-overlapping.

In each shot, whether it be a shot for the HI image 64 or a shot for one of the LO images 56, 58, 60, 62, an acquisition sequence is applied, such as a gradient echo sequence or spin echo sequence, to acquire a predetermined number of k-space lines ($K_{shot}$) Hence, the acquisition time for a shot ($T_{shot}$) is the repetition time (TR)×$K_{shot}$. Typically, shots of the HI image 64 employ a gradient echo sequence. Because the HI image 64 has a higher resolution than the LO images 56, 58, 60, 62, the k-space of the HI image 64 is larger than the k-space of any one of the LO images 56, 58, 60, 62. Further, the k-space of the HI image 64 is acquired over a plurality of shots, whereas the k-space of one of the LO images 56, 58, 60, 62 is acquired over one or more shots, the number of the one or more shots, typically one, less than the number of the plurality of shots.

It is contemplated that the HI image 64 and the LO images 56, 58, 60, 62 may be acquired with different combinations of imaging pulses so as to effect different image contrast (e.g., different T1 and T2 weighting, respectively). Further, it is contemplated that the each shot can be employed to generate image data at a different location within the subject 12. In other words, for each shot, the gradient fields can be varied to capture image data at spatially different locations within the subject 12. For example, the HI image 64 can be captured at a first location within the subject 12, and the LO images 56, 58, 60, 62 can be captured at a second location within the subject 12, different than the first location.

Suitably, the SHILO imaging sequence 54 is employed for perfusion/permeability imaging of an organ or tissue. It allows simultaneous accurate sampling of the AIF and tissue curves. It finds particular application in cases where higher spatial resolution is required for accurate sampling of tissues curves, because of the need to capture tissue heterogeneity or because of the small size of the tissue examined. Hence, it can be applied to a variety of subjects, ranging from human subjects to small animal subjects, and a variety of vascular territories, including heart, liver, vessel wall, brain, kidneys peripheries, and other organ systems.

In some embodiments, the SHILO imaging sequence 54 is employed in dynamic contrast enhanced (DCE) MR imaging. The SHILO imaging sequence 54 allows for AIF and tissue enhancement curve to be acquired within the same acquisition, despite differences in dynamic signal range, spatial and temporal resolution requirements. In such embodiments, the subject 12 is injected with a contrast agent, such as Gadolinium (Gd)-chelates, before imaging. Images of the AIF and the vessel wall are then acquired using the LO images 56, 58, 60, 62 and the HI image 64, respectively.

To illustrate, assume 128 lines of k-space (referred to as $K_{HI}$) have to be acquired to achieve satisfactory spatial resolution for the HI image 64. Further, assume the HI image 64 is acquired over 4 shots 66, 68, 70, 72, each encompassing acquisition of 32 k-space lines (referred to as $K_{shot}$). For a given TR, the acquisition time for a shot will be TR×$K_{shot}$ ($T_{shot}$), while the time required to acquire the entire HI image 64 will be TR×$K_{HI}$ (not considering the time required for RF pulses and gradient switching). If a saturation pulse is applied before the first excitation of each shot, and SD before acquisition of the HI image 64 is longer than $T_{shot}$, an additional shot can be inserted during the delay for one of the LO images 56, 58, 60, 62. If $K_{shot}$ (32 k-space lines in this case) provides sufficient spatial resolution, the LO image from the inserted shot acquired at a shorter, optimal delay after saturation could be used for acquisition.

By fitting the acquisition of the LO image after the saturation pulse, but before the acquisition of the HI image 64, it is possible to acquire two images with different dynamic signal range, different spatial resolution and temporal resolution within the same acquisition. The different dynamic signal range derives from the shorter SD and longer SD delay after saturation. The different spatial resolution derives from different number of k-space lines acquired (32 lines for the LO image and 128 lines for the HI image 64). The different temporal resolution derives from the fact that the LO image is acquired as a single-shot (i.e., one image after every saturation pulse applied), while the HI image 64 is acquired as a multi-shot. For every HI (tissue) image, 4 LO (AIF) images are acquired, with an acceleration factor determined by the number of shots necessary to acquire the HI image.

Using the HI image 64 and the LO images 56, 58, 60, 62, a "model-based" method can be used to extract physiological parameters from uptake curves. For example, as discussed above, Tofts and Kermode (TK) model, which estimates several kinetic parameters in the tissue of interest, can be employed. Such kinetic parameters include one or more of: (1) the transfer constant from the plasma compartment to the tissue of interest ($K^{trans}$); (2) the transfer constant from the tissue of interest to the plasma compartment ($K_{ep}$); (3) the fractional plasma volume ($v_p$); and (4) the extra-vascular extra-cellular volume ($V_e$).

In alternative embodiments, the plurality of saturation pulses 82, 84, 86, 88 may be replaced with a different set of RF pulses such as to prepare the final image contrast differently for the resulting images and to effect a difference between the HI image 64 and the LO images 56, 58, 60, 62. Further, it is to be appreciated that SHILO is applicable to multi-slice applications. That is to say, the HI image 64 and the LO images 56, 58, 60, 62 are captured for each slice.

Figure 4:
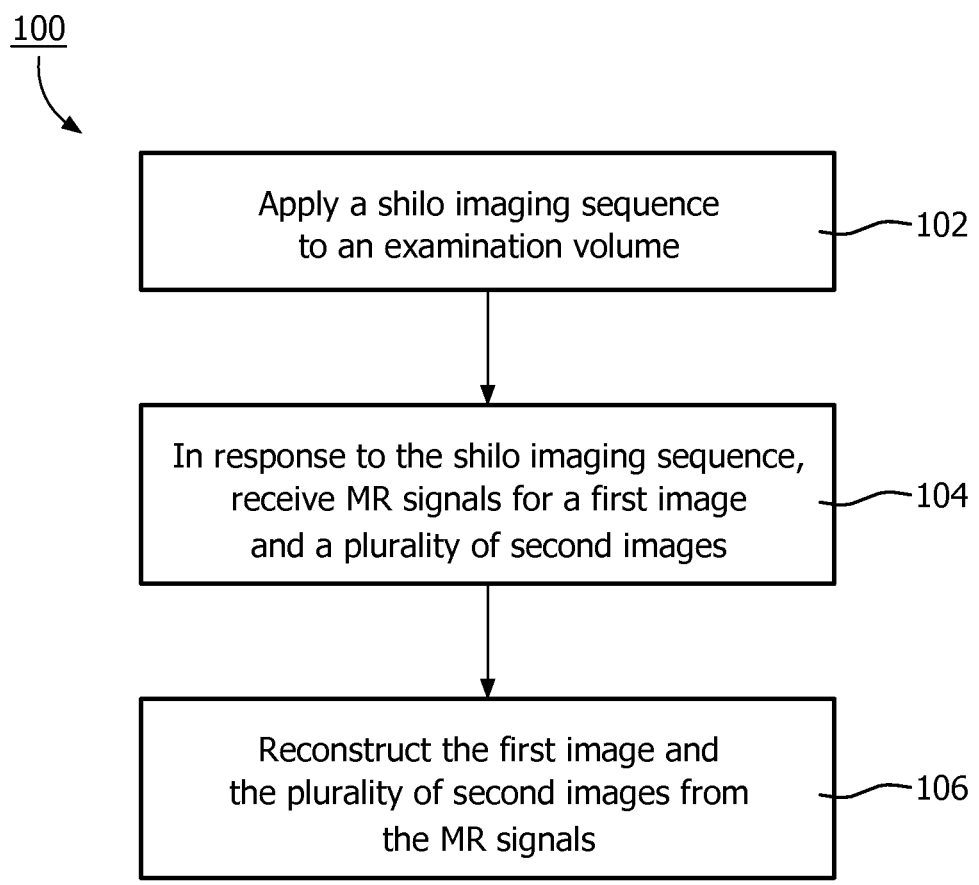
FIG. 4 is a method of imaging a subject using the SHILO imaging sequence.

With reference to FIG. 4, a method 100 for imaging the subject 12 is provided. The method includes applying 102 by the MR scanner 48 the SHILO imaging sequence 54 to the examination volume 18. The imaging sequence 54 includes a plurality of evenly spaced saturation pulses 82, 84, 86, 88 and, for a first saturation delay (SD), a second SD, and each of at least one of the plurality of saturation pulses 82, 84, 86, 88, both a shot 66, 68, 70, 72 for a first image 64 spaced the first SD from the saturation pulse and a shot 74, 76, 78, 80 for one of a plurality of second images 56, 58, 60, 62 spaced the second SD from the saturation pulse. The method 100 further includes, in response to the imaging sequence 54, receiving 104 by the MR scanner 48 MR signals for the first image 64 and the plurality of second images 56, 58, 60, 62. A temporal resolution of the second images 56, 58, 60, 62 exceeds a temporal resolution of the first image 64, and a spatial resolution of the first image 64 exceeds a spatial resolution of the second images 56, 58, 60, 62. The method 100 can further include reconstructing 106 the first image 64 and the second images 56, 58, 60, 62 from the received magnetic resonance signals.

As used herein, a memory includes one or more of a non-transient computer readable medium; a magnetic disk or other magnetic storage medium; an optical disk or other optical storage medium; a random access memory (RAM), read-only memory (ROM), or other electronic memory device or chip or set of operatively interconnected chips; an Internet/Intranet server from which the stored instructions may be retrieved via the Internet/Intranet or a local area network; or so forth. Further, as used herein, a processor includes one or more of a microprocessor, a microcontroller, a graphic processing unit (GPU), an application-specific integrated circuit (ASIC), an FPGA, and the like; a controller includes: (1) a processor and a memory, the processor executing computer executable instructions on the memory embodying the functionality of the controller; or (2) analog and/or digital hardware; a user input device includes one or more of a mouse, a keyboard, a touch screen display, one or more buttons, one or more switches, one or more toggles, and the like; a database includes one or more memories; and a display device includes one or more of a LCD display, an LED display, a plasma display, a projection display, a touch screen display, and the like.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance (MR) system for imaging a subject, said system comprising:
   an MR scanner defining an examination volume and configured to:
      apply an imaging sequence to the examination volume, the imaging sequence including:
         a plurality of saturation pulses;
         after a first saturation delay (SD) after at least one of the plurality of saturation pulses, collecting image data for a first image in a first shot spaced the first SD from the saturation pulse; and,
         after a second SD after the at least one of the plurality of saturation pulses, collecting image data for one of a plurality of second images in a second shot spaced the second SD from the saturation pulse; and,
      in response to the imaging sequence, receive the image data for the first image and the plurality of second images, a temporal resolution of the second images exceeding a temporal resolution of the first image, and a spatial resolution of the first image exceeding a spatial resolution of the second images.

2. The system according to claim 1, wherein the at least one of the plurality of saturation pulses includes all of the plurality of saturation pulses.

3. The system according to claim 1, wherein the first image is an n-shot image and each of the plurality of second images is an m-shot image, where n is greater than 1 and m is less than n.

4. The system according to claim 1, wherein the first SD is greater than the second SD.

5. The system according to claim 1, wherein the subject is injected with a contrast agent, before imaging.

6. The system according to claim 1, wherein the first image is of a vessel wall and the second images are used to determine an arterial input function (AIF) feeding the vessel wall.

7. The system according to claim 1, wherein the plurality of saturation pulses are spaced by a saturation repetition time, a sum of the first SD and an acquisition time for the shot of the first image is less than the saturation repetition time, and a sum of the second SD and an acquisition time for the shot of the one of the plurality of second images is less than the saturation repetition time.

8. The system according to claim 1, wherein each shot includes an acquisition sequence to collect a plurality of lines of k-space.

9. The system according to claim 8, wherein image data for the first image and the plurality of second images are received from different spatial locations within the subject.

10. The system according to claim 9, further including:
    a reconstruction processor configured to reconstruct the first image and the second images from the received magnetic resonance signals.

11. A method for imaging a subject, said method comprising:
    applying by an MR scanner an imaging sequence to an examination volume, the imaging sequence including:
       a plurality of saturation pulses;
       after a first saturation delay (SD) after at least one of the plurality of saturation pulses, collecting image data for a first image in a first shot spaced the first SD from the saturation pulse; and,
       after a second SD after the at least one of the plurality of saturation pulses, collecting image data for one of a plurality of second images in a second shot spaced the second SD from the saturation pulse; and, in response to the imaging sequence, receiving by the MR scanner the image data for the first image and the plurality of second images, a temporal resolution of the second images exceeding a temporal resolution of the first image, and a spatial resolution of the first image exceeding a spatial resolution of the second images.

12. The method according to claim 11, wherein the at least one of the plurality of saturation pulses includes all of the plurality of saturation pulses.

13. The method according to claim 11, wherein the first image is an n-shot image and each of the plurality of second images is an m-shot image, where n is greater than 1 and m is less than n.

14. The method according claim 11, wherein the first image is of a vessel wall and the second images are used to determine an arterial input function (AIF) feeding the vessel wall.

15. The method according to claim 11, wherein the plurality of saturation pulses are spaced by a saturation repetition time, a sum of the first SD and an acquisition time for the shot of the first image is less than the saturation repetition time, and a sum of the second SD and an acquisition time for the shot of the one of the plurality of second images is less than the saturation repetition time.

16. The method according to claim 11, wherein image data for the first image and the plurality of second images are received from different spatial locations within the subject.

17. The method according to claim 11, further including: reconstructing the first image and the second images from the received image data.

18. A dynamic contrast enhanced (DCE) magnetic resonance (MR) system for imaging a subject injected with a contrast agent, said system comprising:
   an MR scanner defining an examination volume and configured to:
      apply a series of radiofrequency (RF) pulses to the examination volume, each pulse inducing resonance;
      after a short delay after each pulse, acquire resonance imaging data for each of a plurality of high temporal resolution, low spatial resolution images;
      after a long delay after each of a plurality of the pulses and after collecting the resonance imaging data for one of the high temporal, low spatial resolution images, acquire resonance imaging data for low temporal resolution, high spatial resolution images;
      reconstruct the resonance imaging data acquired the short delay after each of the pulses into one of the plurality of high temporal resolution, low spatial resolution images; and,
      reconstruct the resonance imaging data acquired the long delay after a plurality of pulses into one of the low temporal resolution, high spatial resolution images.

19. The system according to claim 18, wherein the image data is acquired from an arterial region of the subject, and wherein the system further includes:
   a processor configured to generate an arterial input function (AIF) from the plurality of high temporal resolution, low spatial resolution images.

20. The system according to claim 19, wherein the low temporal resolution, high spatial resolution images depict a vessel wall, and where the system further includes:
   a display device configured to concurrently display the vessel wall and the AIF.

* * * * *